_(12)_ United States Patent
Kajita

(10) Patent No.: US 6,833,295 B2
(45) Date of Patent: Dec. 21, 2004

(54) METHOD OF MANUFACTURING A SEMICONDUCTOR DEVICE

(75) Inventor: Yoko Kajita, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/630,869

(22) Filed: Jul. 31, 2003

(65) Prior Publication Data

US 2004/0126989 A1 Jul. 1, 2004

(30) Foreign Application Priority Data

Dec. 25, 2002 (JP) ........................................ 2002-373426

(51) Int. Cl.[7] ................... H01L 21/336; H01L 21/8234
(52) U.S. Cl. ....................... 438/197; 438/435; 438/595
(58) Field of Search ........................ 438/197, 230, 438/269, 303, 435, 585, 595

(56) References Cited

U.S. PATENT DOCUMENTS 6,258,679 B1 * 7/2001 Burns et al. ................. 438/303

FOREIGN PATENT DOCUMENTS

JP          2001-257357        9/2001

OTHER PUBLICATIONS

Recessed–Channel Structure for Fabricating Ultrathin SOI MOSFET with Low Series Resistance, Mansun Chan, Fariborz Assaderaghi, Stephen A. Parke, Chenming Hu, *Fellow*, IEEE, and Ping K. Ko, *Senior Member*, IEEE IEEE Electron Device Letter, vol. 15, No. 1, Jan. 1994.

* cited by examiner

*Primary Examiner*—Phuc T. Dang
(74) *Attorney, Agent, or Firm*—Rabin & Berdo, P.C.

(57) ABSTRACT

An oxidation process is performed for a surface of the SOI film exposed from the opening pattern to form and eliminate the silicon oxide film, so that the SOI film would be thinned. In the opening pattern, formed a gate oxide film as a third insulation film, on which a poly-silicon film is formed as a conductive film so as to fill in the opening pattern. The first insulation film is then eliminated while the second insulation film formed on the inner wall of the opening pattern is remained, so that a gate electrode provided on the side wall thereof with a sidewall would be formed on the gate oxide film.

20 Claims, 2 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device using an SOI (silicon on insulator) substrate.

2. Description of the Related Art

As mobile communication equipments appear, power saving has been recently a great problem in addition to conventional miniaturization in demand for development of the semiconductor device. An SOI technology draws attention against such background. In the SOI technology, a CMOS (complementary metal oxide semiconductor) device having high driving performance after deep sub-micron is formed on a silicon substrate in which a silicon film (an SOI film) is completely separated by an oxide film (a buried oxide film) to be piled. An advantage of an SOI device is, in addition to small junction capacitance, that a drain current value at a low gate voltage is superior in rising, that is, a subthreshold becomes near to an ideal S factor. In order to attain this characteristic, required fully depletion by thinning an SOI film. Thinning an SOI film is also advantageous from the viewpoint of restraining short channel effect due to shortening of gate length. Thinning an SOI film, however, simultaneously leads to higher resistance in a diffusion layer portion and instability of a process such as reduction of a margin for through of a buried oxide film in forming contact. Therefore, the thickness of an SOI film should be made thin only for a channel portion under a gate and thick for a diffusion layer portion, respectively.

In order to meet the above demand, disclosed in JP-A-2001-257357, for example, a semiconductor device in which a channel portion under a gate in an SOI film is only thinned and a method of manufacturing the above. An example of such method of manufacturing a semiconductor device will be described here, made with reference to drawings.

In a conventional method of manufacturing a semiconductor device, as shown in FIG. 2A, a semiconductor substrate 112 in which an SOI film 116 of 100 nm in thickness, for example, (a silicon film) is piled through a medium of a box oxide film 114 (a buried oxide film) (referred to as an SOI substrate 100 hereinafter) is first prepared, a thermal oxide film 118 of 10 nm, for example, is formed on the above SOI film 116, and a nitride film 120 of 30 nm, for example, is further formed on the thermal oxide film 118 by means of a CVD method. A photolithography process and an etching process are then carried out to eliminate the thermal oxide film 118 and the nitride film 120 so that a portion to be a channel region of the SOI film 116 would be exposed, and an opening pattern 122 is formed.

Next, as shown in FIG. 2B, the thermal film 118 and the nitride film 120 are used as a mask to carry out a thermal oxidation process for an exposed portion of the SOI film 116, and a thermal oxide film 126 equal to 100 nm, for example, is formed at the same time when a channel region of the SOI film 116 is thinned.

Then, as shown in FIG. 2C, a wet etching process using thermal phosphoric acid and hydrofluoric acid of 1%, for example, is carried out for 20 and 18 minutes, respectively, to eliminate the thermal films 118 and 126 and the nitride film 120. Accordingly, the thickness of the SOI film 116 becomes different between its channel region and other regions (diffusion layer: source and drain regions) so as to be 50 nm and 95 nm, for example.

As shown in FIG. 2D, a thermal oxidation process is then carried out to form a gate oxide film (a gate insulation film) 128 of 10 nm, for example. A channel ion, a B ion, for example, is implanted in an interface between the SOI film 116 and the gate oxide film 128 by means of an ion implantation method to form a channel region 130. After a poly-silicon is deposited over the gate oxide film 128 by means of a CVD method, for example, to form a poly-silicon film of 200 nm, for example, a photolithography process and an etching process are carried out to form a gate electrode 134.

Arsenic is then ion-implanted in the SOI film 116 surrounding the gate electrode 134 under a condition of implantation angle of 30 degrees, 50 KeV and $5 \times 10^{15}$ ions/cm$^2$, for example. After that, an activation annealing process is carried out at 1000 degrees centigrade, for example, so as to form a source region 136 and a drain region 138 as a diffusion layer so that they would self align. Ti, for example, is then sputtered on surfaces of the gate electrode 134, the source region 136 and the drain region 138 so as to carry out a salicide process, so that a gate silicide region 134a, a source silicide region 136a and a drain silicide region 138a would be formed.

An FD (fully depletion) type of MOSFET (power metal oxide semiconductor field effect transistor) is thus formed on an SOI substrate 100 as a semiconductor device.

In the method of manufacturing a semiconductor device as described above, the SOI film 116 of a portion to be a channel region 130 is first thinned and the thermal oxide film 118 and the nitride film 120 used for a mask are then eliminated to form a gate electrode 134. In the above method, however, accuracy in processing the SOI film 116 of the channel region 130 and the gate electrode 134 is determined in accordance with positioning accuracy of a photolithographic exposure equipment.

Therefore, in order to surely thin the SOI film 116 located under the gate electrode 134, it is required to set a thin-film region of the SOI film 116 in advance at a size that twice the positioning accuracy of the exposure equipment is added to a preferred size of a channel region 130. In the case of forming a transistor having a gate width of 0.5 μm, for example, the thin-film region of the SOI film 116 should be set at 0.9 μm when the positioning accuracy of an exposure equipment to be used is 0.2 μm.

This results in excess thinning of the SOI film 116 region other than the channel region 130, which causes problems such as rise in resistance in the diffusion layer (source and drain regions), rise in resistance due to concentration of a current path, rise in resistance due to lack of a contacting area between silicon and silicide and occurrence of defect due to lack of silicon in the silicide process. Furthermore, the gate electrode would be in an off position in many cases since the gate electrode 134 is formed by means of the photolithography and etching processes again after the thermal oxide film 118 and the nitride film 120, which are used as a mask, are eliminated.

On the other hand, in a method of manufacturing a semiconductor device disclosed in JP-A-2001-257357, an opening portion is provided in an insulation film formed on an SOI film. A surface of the SOI film exposed from the opening portion is oxidation-processed to be thinned so as to self-align, poly-silicon is further buried in the opening portion to form a film, and thereby, a gate electrode is formed so as to self-align. Thus, a gate electrode is formed without any problems due to excess thinning of an SOI film region other than a channel region and off position of a gate electrode as mentioned above.

In the above proposition, however, an etching process damages a gate oxide film since an insulation film is eliminated after filling poly-silicon in an opening portion provided in the insulation film to form a film, and thereby, a gate electrode. This causes a problem of deterioration of electric characteristic.

Therefore, a purpose of the invention is to solve the above-described conventional problems and to achieve the following object. That is to say, an object of the invention is to provide a method of manufacturing a semiconductor device capable of forming a gate electrode in fewer processes without any problems due to excess thinning of a silicon film region and off position of a gate electrode and without any damages to a gate insulation film (a gate oxide film) due to an etching process.

SUMMARY OF THE INVENTION

The above problems can be solved by the following method.

That is to say, a method of manufacturing a semiconductor device according to the invention is a method of manufacturing a semiconductor device having a semiconductor substrate in which a silicon film is piled via a buried oxide film, comprising steps of:

forming a first insulation film on the above silicon film;

providing an opening in the above first insulation film to expose a part of the above silicon film;

forming on an inner wall of the above opening a second insulation film whose etching selection ratio is different from that of the above first insulation film;

carrying out an oxidation process for a surface of the above silicon film exposed from the above opening portion to thin the above silicon film;

forming a conductive film so as to fill in the above opening; and eliminating the above first insulation film while remaining the above second insulation film formed on the inner wall of the above opening to form a gate electrode.

Furthermore, a method of manufacturing a semiconductor device according to the invention is a method of manufacturing a semiconductor device having a semiconductor substrate in which a silicon film is piled via a buried oxide film, comprising steps of:

forming a first insulation film on the above silicon film;

providing an opening in the above first insulation film to expose a part of the above silicon film;

forming on an inner wall of the above opening a second insulation film whose etching selection ratio is different from that of the above first insulation film;

carrying out an oxidation process for a surface of the above silicon film exposed from the above opening portion provided on the inner wall thereof with the above second insulation film to thin the above silicon film;

eliminating the silicon oxide film formed in the above opening in the above oxidation process;

forming a third insulation film on the silicon film exposed from the above opening after eliminating the above silicon oxide film formed in the above opening;

forming on the above third insulation film in the above opening a conductive film so as to fill in the above opening;

eliminating the above first insulation film while remaining the above second insulation film formed on the inner wall of the above opening, third insulation film formed in the above opening and the above conductive film to form on the above third insulation film a gate electrode having the above conductive film and the above second insulation film formed on a side wall of the above conductive film; and implanting impurities in the above silicon film with the above gate electrode used as a mask to form a diffusion layer in the above silicon film, and thereby, form a MOSFET on a surface of the above silicon film.

The method of manufacturing a semiconductor device according to the invention is a method of forming a semiconductor device on a semiconductor substrate in which a silicon film is piled via a buried oxide film. In this method, on an inner wall of an opening of a first insulation film formed on the silicon film, formed a second insulation film whose etching selection ratio is different from that of the above first insulation film, and then, an oxidation process is carried out for a surface of the silicon film exposed from the opening to thin the silicon film only in this region. Forming in the opening a conductive film to be a gate electrode so as to fill in the opening allows a gate electrode to be formed without any problems due to excess thinning of a region other than a channel region of a silicon film and off position of a gate electrode.

Moreover, difference in etching selection ratio is used for eliminating the first insulation film while remaining the second insulation film, after forming the conductive film in the opening of the first insulation film so as to fill in the opening. A conductive film provided on its side wall with the second insulation film, that is, a gate electrode provided with a so-called sidewall is thus formed. This allows a gate electrode as well as a sidewall, which is a side wall thereof, to be formed only in one process, which reduces the number of processes, so that a low cost can be achieved. Furthermore, since the second insulation film protects the conductive film and the third insulation film while the first insulation film is eliminated, a gate oxide film (the third insulation film) would not be damaged in the etching process. This allows a gate electrode to be formed while an electric characteristic is prevented from deteriorating.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE INVENTION

A mode for carrying out the invention will be described hereinafter, made with reference to the drawings. A same reference number is used for description of what has substantially the same function through the whole drawings and its description will be omitted in some cases.

FIG. 1 is a view showing a process of a method of manufacturing a semiconductor device according to an embodiment of the invention.

Figure 1A:
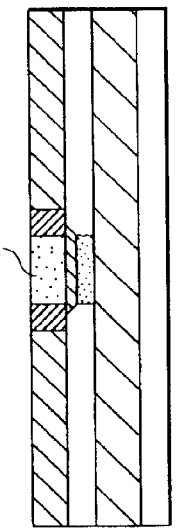
FIG. 1 is a sectional view showing a process of a method of manufacturing a semiconductor device according to an embodiment of the invention.

In this embodiment, as shown in FIG. 1A, a semiconductor substrate 12 on which an SOI film 16 (a silicon film) whose thickness is 250 nm, for example, is piled through a medium of a box oxide film 14 (a buried oxide film) (referred to as an SOI substrate 10, hereinafter) is first prepared. A thermal oxide film 18 (a first insulation film) having a thickness of 300 nm, for example, is formed on the SOI film 16, and a nitride film 20 whose thickness is thinner than the thermal oxide film 18, that is, 10 nm, for example, is further formed on the thermal oxide film 18 by means of a CVD method. A photolithography process and an etching process are carried out to eliminate the thermal oxide film 18 and the nitride film 20 so that a portion to be a channel region of the SOI film 16 would be exposed, and thereby, an opening pattern 22 is formed.

Then, a nitride film is formed again over the whole surface and the nitride film formed over the whole surface is etched in an anisotropic etching process so as to form a sidewall 24 (a second insulation film) comprising a nitride film on an inner wall of the opening pattern 22.

Figure 1B:
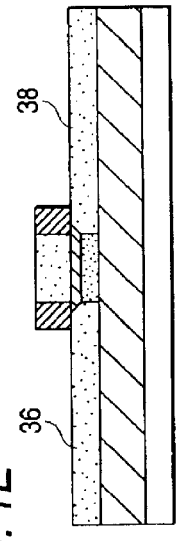

Next, as shown in FIG. 1B, the thermal oxide film 18 and the nitride film 20 are used as a mask to carry out a thermal oxidation process for the exposed portion of the SOI film 16 so as to form a thermal oxide film (a silicon oxide film) 26 having a thickness equal to 100 nm, for example, while making the channel region of the SOI film 16 thinner. Accordingly, the SOI film 16 has different thicknesses of 50 nm and 100 nm, for example, between its channel region (a region in which a gate electrode is formed) and other regions (a diffusion layer: source and drain regions). That is to say, the thickness of the channel region of the SOI film 16 becomes thinner than that of other regions. Thinning the channel region of the SOI film 16 as described above allows a short channel effect to be restrained.

Figure 1C:
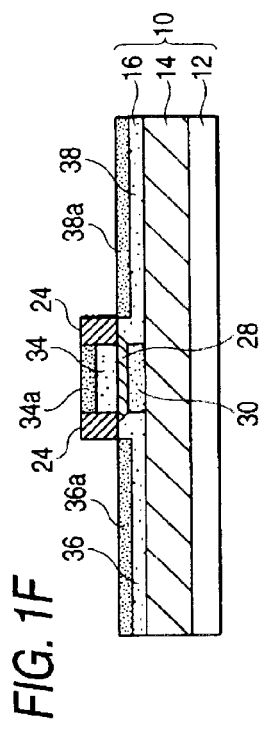

As shown in FIG. 1C, a wet etching process using 1% hydrofluoric acid for example, is then carried out for 18 minutes to eliminate a thermal oxide film 26 so that the SOI film 16 would be exposed again. The exposed portion of the SOI film 16 undergoes a thermal oxidation process to form a gate oxide film (a gate insulation film: a third insulation film) 28 having a thickness of 10 nm, for example. A channel ion, a B ion, for example, is implanted in an interface between the SOI film 16 and the gate oxide film 28 by means of an ion implantation method to form a channel region 30. And then, a poly-silicon is deposited over the whole surface so as to fill the opening pattern 22 by means of a CVD method, for example, to form a poly-silicon film 32 having a thickness of 400 nm, for example.

Figure 1D:
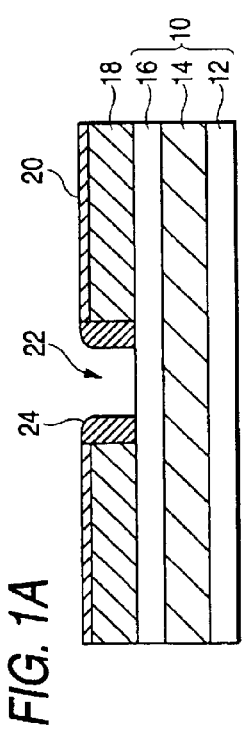

Next, as shown in FIG. 1D, an etching back method or a CMP (chemical and mechanical polishing) method, for example, is used for smoothing the surface while eliminating an unnecessary poly-silicon film 32 formed on the nitride film 20, so that a gate electrode 34 consisting of poly-silicon would be formed inside the opening pattern 22 so as to self align. The nitride film 20 is here eliminated together with an unnecessary poly-silicon film 32 thereon since it is thin such as 10 nm in thickness.

Figure 1E:
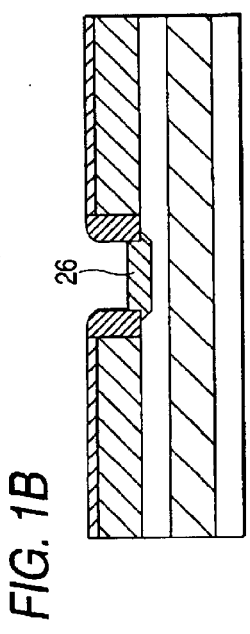

As shown in FIG. 1E, a wet etching process using hydrofluoric acid of 5%, for example, is then carried out for 10 minutes to eliminate a thermal oxide film 18. Sidewalls 24 comprising a nitride film (SiN), and the thermal oxide film 18 ($SiO_2$) have a different etching selection ratios, respectively. Concretely, $SiO_2$ has an etching selection ratio that is faster than SiN. Thus, the sidewall 24 comprising a nitride film (SiN) remains while the thermal oxide film 18 is eliminated, so that a gate electrode 34 provided on its side wall with the sidewall 24 would be formed.

Figure 1F:
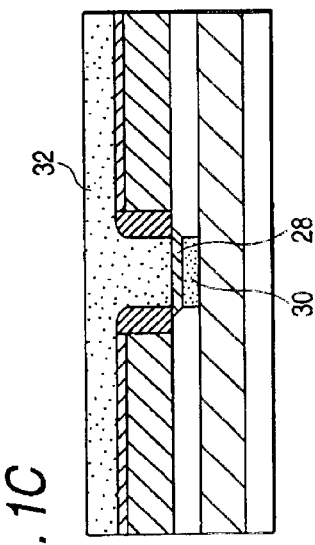
Figure 2A:
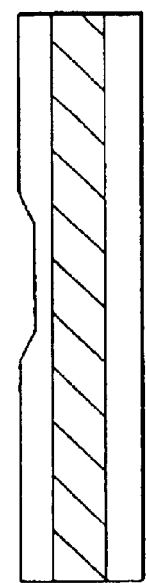
FIG. 2 is a sectional view showing a process of a conventional method of manufacturing a semiconductor device.
Figure 2B:
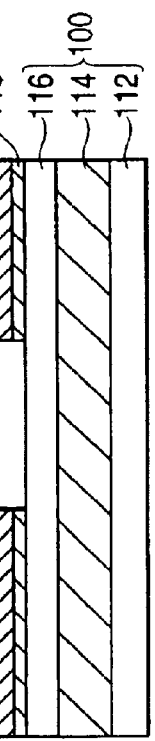
Figure 2C:
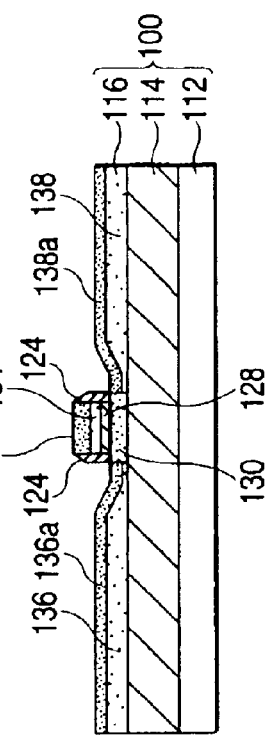
Figure 2D:
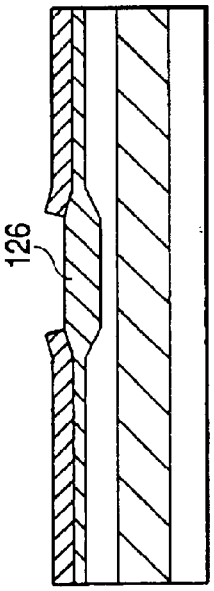

Then, as shown in FIG. 1F, the gate electrode 34 is used as a mask to ion-implant (impurity-implant) arsenic in the SOI film 16 surrounding the gate electrode 34 under a condition of an implantation angle of 30 degrees, 50 KeV and $5 \times 10^{15}$ ions/$cm^2$, for example. After that, an activation annealing process is carried out at 1000 degrees centigrade, for example, so as to form a source region 36 and a drain region 38 as a diffusion layer so that they would self align. Ti, for example, is then sputtered on surfaces of the gate electrode 34, the source region 36 and the drain region 38 so as to carry out a salicide process, so that a gate silicide region 34a, a source silicide region 36a and a drain silicide region 38a would be respectively formed.

An FD type of MOSFET is thus formed on the SOI substrate 10 as a semiconductor device.

As described above, in this embodiment, a thermal oxidation process is carried out for the SOI film 16, which has been exposed by means of the opening pattern 22 of the thermal oxide film 18, so that the SOI film 16 would be thinned and self align, and a poly-silicon is deposited in the opening pattern 22 so as to fill the opening pattern 22 to form the gate electrode 34, which would self align. Therefore, it is not necessary to consider limitation due to positioning accuracy of a photolithographic exposure equipment, which causes no excess thinning of a region other than the channel region 30 of the SOI film 16 and no off position of the gate electrode 34.

In this embodiment, the sidewall 24 is formed on the inner wall of the opening pattern 22 of the thermal oxide film 18 to form the gate electrode 34 in the opening pattern 22, and then, a difference of an etching selection ratio is utilized to keep the sidewall 24, on one hand, while eliminating the thermal oxide film 18, on the other hand. That is to say, the gate electrode 34 and the sidewall 24 on a side wall thereof are formed in one process. Accordingly, a process for forming the sidewall 24, which has been separately required conventionally, can be omitted, and thereby, a lower cost can be achieved.

Furthermore, the sidewall 24 plays a roll of protecting the gate electrode 34 and the gate oxide film 28 in eliminating the thermal oxide film 18. Thus, the gate oxide film 28 is not damaged in an etching process, so that an electric characteristic can be prevented from deteriorating.

In this embodiment, a nitride film highly resistant to oxidation is used as the sidewall 24 formed on the inner wall of the opening pattern 22 of the thermal oxide film 18. Thus, in a thermal oxidation process for thinning the SOI film 16 or forming the gate oxide film 28, oxidation in a lateral direction of an exposed portion of the SOI film 16 is restrained while that of a downward direction is accelerated. This can more effectively prevent a region of the SOI film other than the channel region from being excessively thinned. Moreover, this makes the difference in size conversion due to oxidation small, which allows an oxide film to be formed into an almost equal size as the opening pattern 22. Accordingly, the gate electrode 34 can be formed with good accuracy in size even when its pattern is fine, and miniaturization of a device also can be achieved as a whole.

In this embodiment, the nitride film 20 highly resistant to oxidation is further formed on the thermal oxide film 18 as a mask in respective oxidation processes, so that oxidation of a region other than a portion of the SOI film 16 exposed by means of the opening pattern 22 can be further prevented.

It goes without saying that a method of manufacturing a semiconductor device of the invention according to the above embodiment is not construed restrictively but can be achieved in a scope of satisfying requirements of the invention.

As described above, in accordance with the invention, it is possible to provide a method of manufacturing a semiconductor device capable of forming a gate electrode in a few processes without any problems due to excess thinning of a silicon film region and off position of a gate electrode and without any damages to a gate oxide film due to an etching process.

What is claimed is:

1. A method of manufacturing a semiconductor device, comprising:

preparing a semiconductor substrate on which a silicon film is piled via a buried oxide film;

forming a first insulation film on the silicon film;

providing an opening in the first insulation film to expose a part of the silicon film;

forming on an inner wall of the opening second insulation film having an etching selection ratio that is different from an etching selection ratio of the first insulation film;

carrying out an oxidation process on a surface of the silicon film exposed from the opening, which opening is provided on the inner wall thereof with the second insulation film, to thin the silicon film;

forming a conductive film so as to fill in the opening; and eliminating the first insulation film to form a gate electrode having the conductive film and the second insulation film formed on a side wall of the conductive film.

2. The method of manufacturing a semiconductor device as in claim 1, wherein the first insulation film has an etching selection ratio in which the etching speed is faster than that of the second insulation film.

3. The method of manufacturing a semiconductor device as in claim 1, wherein the first insulation film is a silicon oxide film.

4. The method of manufacturing a semiconductor device as in claim 1, wherein the second insulation film is a silicon nitride film.

5. The method of manufacturing a semiconductor device as in claim 1, wherein the step of thinning the silicon film is achieved by eliminating a silicon oxide film formed in the oxidation process carried out on a surface of the silicon film exposed from the opening.

6. The method of manufacturing a semiconductor device as in claim 1, further comprising implanting impurities in the silicon film with the gate electrode used as a mask to form a diffusion layer on the silicon film, and thereby, forming a MOSFET on a surface of the silicon film.

7. The method of manufacturing a semiconductor device as in claim 6, wherein the MOSFET is of a fully depletion type.

8. The method of manufacturing a semiconductor device as in claim 6, wherein, in the step of thinning the silicon film, the thickness of the silicon film becomes thinner in a region in which the gate electrode is formed than in a region in which the diffusion layer is formed.

9. A method of manufacturing a semiconductor device comprising:

preparing a semiconductor substrate on which a silicon film is piled via a buried oxide film;

forming a first insulation film on the silicon film;

providing an opening in the first insulation film to expose a part of the silicon film;

forming on an inner wall of the opening a second insulation film having an etching selection ratio that is different from an etching selection ratio of the first insulation film;

carrying out an oxidation process on a surface of the silicon film exposed from the opening, which opening is provided on the inner wall thereof with the second insulation film, to thin the silicon film;

eliminating the silicon oxide film formed in the opening in the oxidation process;

forming a third insulation film on the silicon film exposed from the opening after eliminating the silicon oxide film formed in the opening;

forming on the third insulation film in the opening a conductive film so as to fill in the opening;

eliminating the first insulation film while retaining the second and third insulation films formed on the inner wall of the opening and the conductive film; and implanting impurities in the silicon film with the gate electrode used as a mask to form a diffusion layer in the silicon film, and thereby, thereby forming a MOSFET on a surface of the silicon film.

10. The method of manufacturing a semiconductor device as in claim 9, wherein the first insulation film has an etching selection ratio in which the etching speed is faster than that of the second insulation film.

11. The method of manufacturing a semiconductor device as in claim 9, wherein the first insulation film is a silicon oxide film.

12. The method of manufacturing a semiconductor device as in claim 9, wherein the second insulation film is a silicon nitride film.

13. The method of manufacturing a semiconductor device as in claim 9, wherein the MOSFET is of a fully depletion type.

14. The method of manufacturing a semiconductor device as in claim 9, wherein the step of forming the third insulation film is carried out by means of a thermal oxidation method.

15. The method of manufacturing a semiconductor device as in claim 9, wherein, in the step of thinning the silicon film, the thickness of the silicon film becomes thinner in a region on the top of which the conductive layer is formed than in a region in which the diffusion layer is formed.

16. A method of manufacturing a semiconductor device comprising:

preparing a semiconductor substrate by forming a box insulating layer on the substrate and forming a silicon film on the box insulating layer;

forming a first insulating layer on the silicon film;

removing a part of the first insulating layer to expose a part of the silicon film through an opening having an inner wall;

forming a second insulating layer on the inner wall of the opening;

subjecting the exposed silicon film to an oxidation process to form an oxidation layer on the exposed silicon film;

removing the oxidation layer so that a thickness of the exposed silicon film is reduced;

forming a gate insulating layer on the exposed silicon film;

forming a conductive film on the gate insulating layer; and forming a source/drain region on the silicon film.

17. A method of manufacturing a semiconductor device according to claim 16, wherein the first insulating layer is a silicon oxide film.

18. A method of manufacturing a semiconductor device according to claim 16, wherein the formation of the first insulating layer includes forming a silicon oxide film on the silicon film and forming a silicon nitride layer on the silicon oxide film.

19. A method of manufacturing a semiconductor device according to claim 16, wherein the second insulating layer is a silicon nitride film.

20. A method of manufacturing a semiconductor device according to claim 16, wherein the conductive film is a doped silicon film.

* * * * *